(12) United States Patent
Droz

(10) Patent No.: US 7,150,406 B2
(45) Date of Patent: Dec. 19, 2006

(54) THIN ELECTRONIC LABEL AND METHOD FOR MAKING SAME

(75) Inventor: François Droz, La Chaux-de-Fonds (CH)

(73) Assignee: Nagraid S.A. (CH)

( * ) Notice: Subject to any disclaimer, the term of this patent is extended or adjusted under 35 U.S.C. 154(b) by 0 days.

(21) Appl. No.: 10/489,476

(22) PCT Filed: Sep. 17, 2002

(86) PCT No.: PCT/IB02/03953

§ 371 (c)(1),
(2), (4) Date: Mar. 12, 2004

(87) PCT Pub. No.: WO03/026010

PCT Pub. Date: Mar. 27, 2003

(65) Prior Publication Data

US 2004/0256466 A1    Dec. 23, 2004

(30) Foreign Application Priority Data

Sep. 18, 2001   (CH) .................................... 1718/01

(51) Int. Cl.
*G06K 19/02* (2006.01)
*G06K 19/06* (2006.01)
(52) U.S. Cl. ...................... 235/492; 235/488
(58) Field of Classification Search ................ 235/487, 235/492, 488; 257/679
See application file for complete search history.

(56) References Cited

U.S. PATENT DOCUMENTS

| | | | | |
|---|---|---|---|---|
| 4,727,246 A | * | 2/1988 | Hara et al. .................. 235/488 |
| 5,519,201 A | * | 5/1996 | Templeton et al. .......... 235/492 |
| 5,888,624 A | * | 3/1999 | Haghiri et al. ............. 428/195.1 |
| 6,140,697 A | * | 10/2000 | Usami et al. ................ 257/679 |
| 6,325,294 B1 | * | 12/2001 | Tuttle et al. ................ 235/492 |
| 6,378,774 B1 | * | 4/2002 | Emori et al. ................ 235/492 |
| 6,497,371 B1 | * | 12/2002 | Kayanakis et al. ......... 235/492 |
| 6,923,378 B1 | * | 8/2005 | Jones et al. ................ 235/488 |

FOREIGN PATENT DOCUMENTS

| | | |
|---|---|---|
| DE | 3019207 A | 11/1981 |
| EP | 0307773 A | 3/1989 |
| EP | 0514637 A | 11/1992 |
| EP | 0734063 A | 9/1996 |
| WO | WO 0126910 A | 4/2001 |

\* cited by examiner

*Primary Examiner*—Jared J. Fureman
*Assistant Examiner*—Jamara A. Franklin
(74) *Attorney, Agent, or Firm*—Woodard, Emhardt, Moriarty, McNett & Henry LLP

(57) ABSTRACT

The aim of this invention is to provide a thin flexible card or electronic label, wherein are mounted electronic components with a reliable electric connection between their contacts and card conductors. The card or electronic label is produced by assembling at least one thin, flexible substrate (7), a conductive layer (4), an adhesive layer (1), and at least one electronic component (11). The substrate (7) includes at least one window (8) wherein is housed the electronic component (11), the adhesive layer (1) maintains the conductive layer (8) on the substrate, the conductive layer (4) extends partially into the window's surface (8) so as to form at least one electric contact (4') whereon the electronic component (11) is connected. The substrate (7) has a thickness preferably selected on the basis of the greatest height of the electronic component (11) to be mounted.

12 Claims, 2 Drawing Sheets

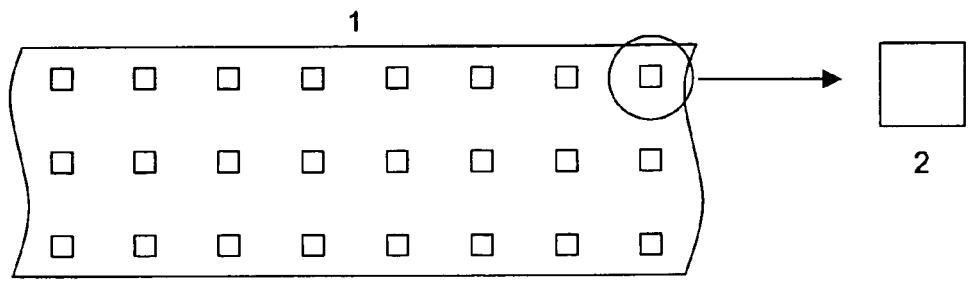
Fig. 1
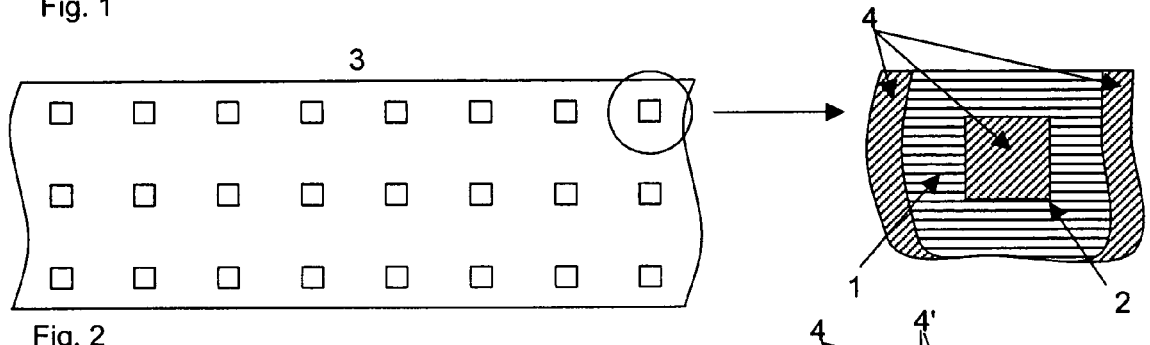
Fig. 2
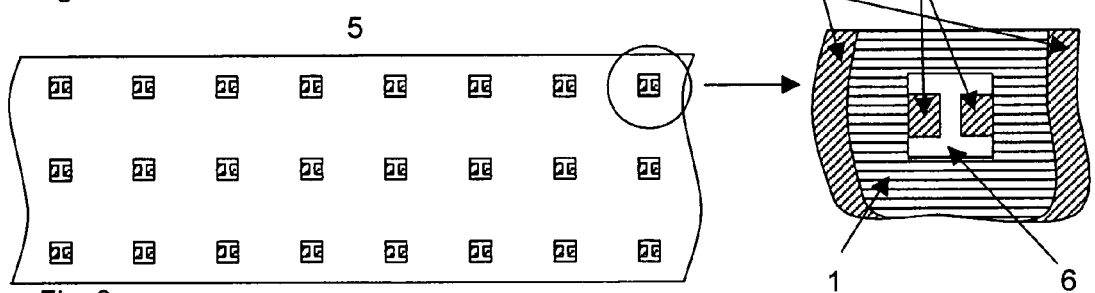
Fig. 3
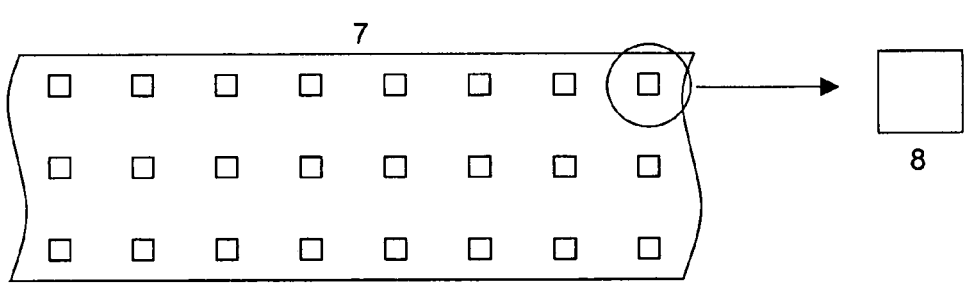
Fig. 4
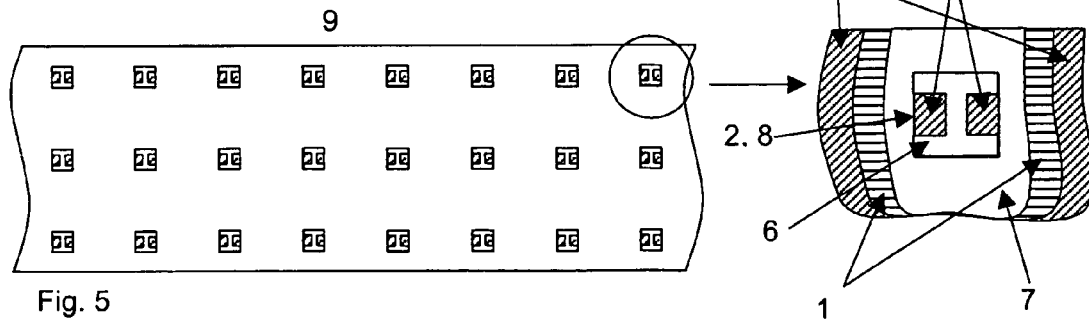
Fig. 5
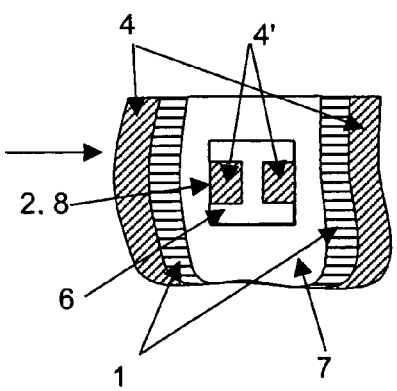

THIN ELECTRONIC LABEL AND METHOD FOR MAKING SAME

This invention concerns a thin card or electronic label comprising at least one electronic component and also a method for manufacturing this type of card.

The invention concerns a card with or without external contact or an electronic label. Electronic label is understood to mean an assembly comprising at least a support, an antenna and an electronic component, generally a chip. The card or the electronic label according to the invention is present in many applications as means for identification, control or payment.

The object of this invention is focused particularly on cards or on thin, flexible cards in which at least one electronic component is mounted. An electronic component is an element such as: a chip, a capacitor, a resistor, a fuse, a battery, a display, a fingerprint controller ("fingertip") or any other similar element.

Those skilled in the art know of cards or electronic labels on which components are mounted in an insulating support called a substrate, on which tracks and connector areas are engraved in conductive material (generally made of copper). The components are generally adhered, and then their contacts are soldered onto the tracks or on the conductive connector areas of the substrate. In order to protect the components and the circuit wired in this way, an epoxy resin is cast on all or part of the surface so as to coat the whole circuit.

The document EP1167068 describes a connection by means of pressing the chip contacts into the tracks engraved on a substrate and originating from a coil-shaped antenna. The chip connection is carried out without soldering thanks to spikes previously added on the contacts and intended to be pushed into the metal of the conductive track. The assembly is then coated with resin and/or covered with an insulating layer.

Both types of known cards or electronic labels described above present the drawbacks of having on one hand a high thickness which is difficult to control during manufacturing and on the other hand a limited flexibility. In fact, components have different heights and the coating thickness must correspond to the maximum height reached by at least one of the components in order to assure an acceptable flatness of the card. As information, the usual thickness of a card is 0.76 mm in accordance with the ISO 7816 standards.

In the second case where the contacts of the component are fixed by pressing into the conductors engraved in the substrate, the quality of contact-conductor connection varies depending on the mechanical constraints to which the card is subjected such as flexion or distortion.

The aim of this invention is to avoid the drawbacks described above, namely to obtain a flat, thin and flexible card or electronic label that provides a minimal waste ratio during manufacturing. This particularly concerns the quality of the electric connection between the electronic component(s) and the tracks on the conductive part of the card.

It is also another aim of this invention to propose a manufacturing method for this type of card or electronic label.

This aim is reached with a card or electronic label obtained by assembling at least one thin flexible substrate, a conductive layer and an adhesive layer, and comprising at least one electronic component, said conductive layer being formed by conductive tracks defining an antenna, characterized in that the substrate includes at least one window in which the electronic component is housed, the adhesive layer maintains the conductive layer on the substrate and the conductive layer extends partially in the surface of the window in order to form at least one electrical contact whereon the electronic component is connected.

The card or the electronic label according to the invention is made up of an insulating layer called substrate, the thickness of which is preferably selected according on the basis of the greatest height of the component to be mounted. This selected substrate's thickness determines the final aspect of the card or label, namely if the component will show on the card surface, form a relief or a cavity on the card.

Said substrate includes windows that are used for housing the electronic components. The dimensions of the windows are determined according to the dimensions of the component and according to the necessary space around the latter. According to a first embodiment, the space around the component is minimal in order to maintain the electronic component temporarily in its housing before the soldering phase.

According to another embodiment, the space is larger in order to fill it with binder or so that it can receive more than one component.

The component contacts are connected to conductive tracks engraved on at least one face of the substrate. These contacts are connected either by means of a direct connection on the conductive tracks, namely on the prolongation of the conductive layer in the window, or through a conductive bridge. Various configurations are possible:

- both component contacts are connected to the conductive layer by direct connection on the conductive tracks,
- a contact is connected to the conductive layer by direct connection while the other component contact is connected on a more distant connection area of the conductive layer by means of an insulated conductive bridge that passes over other tracks,
- the conductive bridge, connected to a component contact, passes beside the component inside the substrate's window where said component is housed in order for be situated on the opposite side of substrate. The bridge is connected on the conductive face by crossing the substrate according to a method known by those skilled in the art. The other component contact is connected to the conductive layer by direct connection or by means of another bridge as mentioned previously.

A card or an electronic label formed in this way has a thickness that corresponds to the maximum height measured in the set of components used, to which it is necessary to add the thickness of the conductive layer. Its flexibility is all the more great because its thickness is reduced. The mounted components penetrate the thickness of the substrate and are thus protected from mechanical attacks.

The present invention also has as object a method for manufacturing cards or electronic labels carried out by assembling at least one thin, flexible substrate, a conductive layer and an adhesive layer, and comprising at least one electronic component, said conductive layer being made up of conductive tracks defining an antenna, characterized in that it includes the following steps:

- formation of at least one segment in the conductive layer,
- formation of at least one window in the adhesive layer,
- formation of at least one window in the substrate, said window being intended to receive the electronic component,
- superimposition and lamination of the adhesive and conductive layers on the substrate in order to make correspond the openings made previously, execution of an electric circuit made up of a plurality of tracks, and formation of at least one connection surface for the electronic component located in the window of the substrate, positioning and connection of the electronic component in the window formed for that purpose in the substrate.

The aforementioned segment in the conductive layer is an opening generally made by stamping or by etching in the conductive layer. This opening has a shape and dimensions that depend on the configuration of the contacts of the electronic component. It serves to create a connection surface for these contacts during the execution of the electric circuit.

The result of the aforementioned characteristics is a card or an electronic label manufacturing method that includes at least one electronic component, in accordance with the invention, and that requires a reduced number of operations that furthermore are inexpensive. The steps of the manufacturing method can be grouped together and/or carried out in a different order or some can even be eliminated according to the applied characteristics described hereinafter. The properties required for this type of card or electronic label are guaranteed with this method: high flexibility, high reliability due to the efficient holding of the contacts of the electronic components.

The size of the window in the adhesive layer is determined in such a way that it is possible to remove the glue present in the area where the electronic component will be mounted without removing the glue present under the conductive tracks. This definition permits a wide choice of shapes for the adhesive layer formation means.

According to another variant for the manufacturing method of a card or an electronic label in accordance with the invention, it is foreseen not to cut windows in the adhesive layer as described in the first step of said process. In fact, the residual glue present on the surfaces reserved for component contacts, said surfaces that are present in the windows cut in the substrate, can be eliminated using:

chemical means before positioning of electronic components evaporation or exhausting during the electronic component connection (soldering, hot bonding or thermocompression).

According to another variant of the manufacturing method of a card or an electronic label in accordance with the invention, it is foreseen to substitute the adhesive film used to form the adhesive layer with a liquid adhesive deposited on the conductive layer by silk-screening with protective materials for the windows that prevent the depositing of adhesive on the surfaces reserved for component contacts.

According to another variant of a manufacturing method of a card or an electronic label in accordance with the invention, it is foreseen to deposit the adhesive layer on the substrate by silk-screening with protected areas for the windows. The adhesive layer can also be deposited on the entire substrate surface (without protective materials), before the cutting of the windows. The windows formation step in the substrate also allows the removal of the glue in this area. The conductive layer is then assembled on the substrate, leaving the conductive layer contact surfaces reserved for the connection components free from glue.

One of the characteristics of the invention is that the connection part of the electronic component will not appear in over-thickness of the conductive layer and the substrate, which is generally the case according to the examples in the prior art.

The invention will be better understood thanks to the following detailed description and with reference to the annexed drawings that are given as a non-limitative example, in which:

FIG. 1 represents an adhesive film with cuttings of windows,

FIG. 2 represents an assembly made up of the adhesive film superimposed on a film of conductive material, FIG. 3 represents the assembly made up of an adhesive film and the conductive film with the cuttings of segments, FIG. 4 represents a substrate with the cuttings of windows FIG. 5 represents the superimposition of the substrate on the assembly of the conductive film with the glue film, FIG. 6 represents a section of a card or an electronic label with a mounted electronic component.

FIGS. 1 to 6 illustrate the details of the manufacturing method of a card or an electronic label, according to the invention, with the results obtained after each step of the method.

Figure 6:
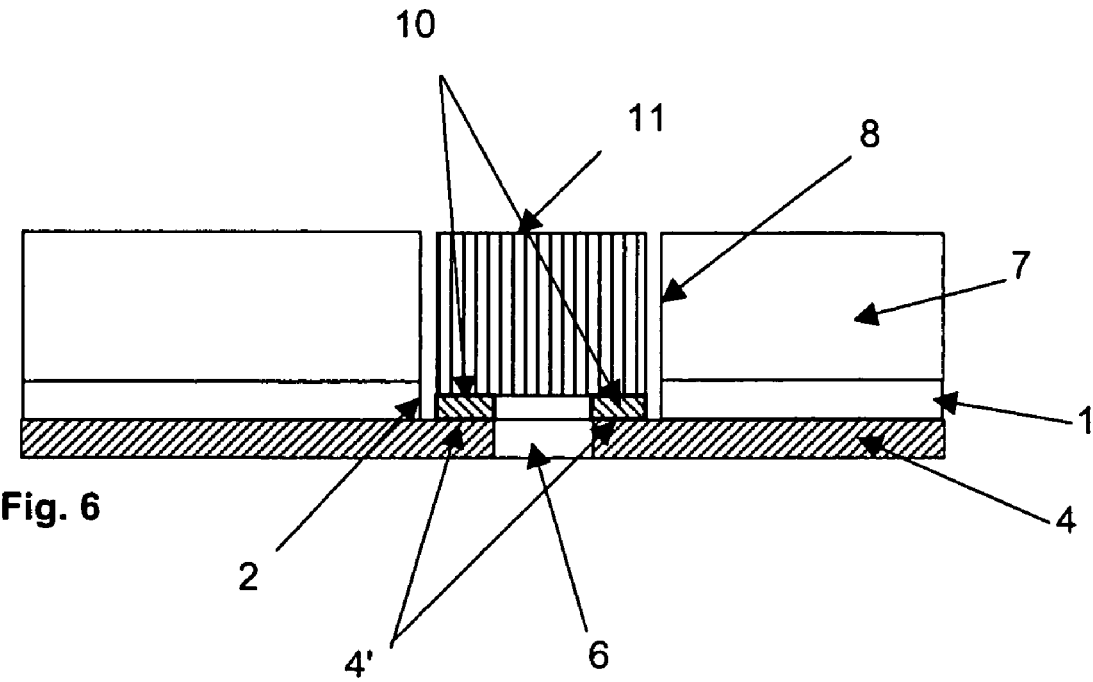

FIG. 1 shows the cutting of windows (2) in an adhesive film (1) carried out by stamping for example. The shape and dimensions of the windows depend on the electronic components to be mounted later. Said adhesive film constitutes the adhesive layer.

The cut adhesive film (1) is superimposed and assembled on a film of conductive material (4) to form the assembly (3) comprising the adhesive layer and conductive layer disclosed in FIG. 2. The conductive material is generally copper. Therefore, the latter appears in the windows (2) of the assembly (3).

The following step is the cutting by stamping or engraving of segments (6) in the windows (2) of the assembly (3) comprising the adhesive layer and conductive layer that permits separate contact surfaces (4') to be prepared for the electronic components. In this way the assembly (5) is obtained. The object of this type of a cutting is to create a separation between two conductive material areas that are still electrically connected by means of the surrounding conductive surface.

FIG. 4 shows an insulating material substrate (7) whose thickness is selected according to the maximum height of the electronic components to be mounted. In this substrate, windows (8) are cut to correspond to the form and dimensions of these components. These windows are generally similar to those cut in the adhesive film in FIG. 1.

The substrate (7) cut in this way is superimposed and assembled on the assembly (3) comprising the adhesive layer and conductive layer in order to make the windows (8) of the substrate correspond with the windows (2) of the assembly comprising the adhesive layer and conductive layer. The result obtained constitutes a substrate assembly (9), comprising an adhesive layer and conductive layer, that is represented in FIG. 5. An enlarged view of the substrate face illustrates windows (2) and (8) superimposed and through which it is possible to distinguish the conductive contact surfaces (4') reserved for the component to be mounted.

One step, not illustrated, is the engraving of a circuit on the conductive face (on the back of assembly (9) obtained previously) made up of a plurality of tracks whose arrangement depends on the electronic components and their contacts. The engraving method used, stamping, machining or chemical etching essentially depends on circuit configuration and on the materials used for the substrate and/or for the conductive film.

The component is then housed in the substrate's window (8) provided for that purpose and then connected for example by soldering, cold or hot conductive bonding to the contact surfaces (4') or thermo-compression.

The final result is shown in the enlarged section of FIG. 6 where it is possible to distinguish the conductive layer made up of the conductive film (4) assembled on the substrate (7) with adhesive film (1) that forms the adhesive layer. The component (11) is housed in the window (2) of the adhesive film (1) superimposed on the window (8) of substrate (7), the contacts (10) of said component are connected to conductive surfaces (4') separated by the segment (6).

Figure 7:
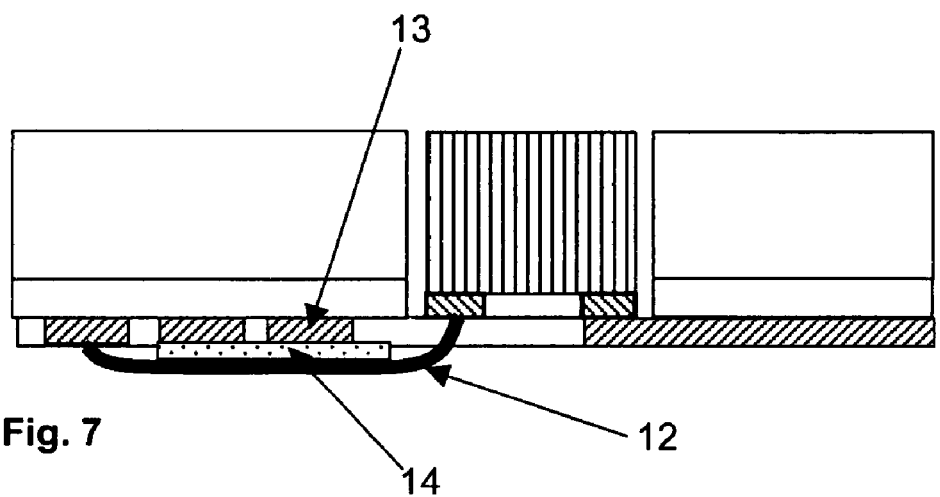
FIG. 7 represents a section of a card or an electronic label with an electronic component that has one contact connected to the conductive layer by means of a bridge.

FIG. 7 shows an electric bridge (12) that connects an electronic component contact (11) to a track positioned at a distance on the conductive layer (4). Said bridge passes over the other tracks (13) and is electrically insulated from the latter by means of a protective material (14). This protective material is generally made up of a thin film piece of insulating material. The other component contact is directly connected on the conductive layer as in FIG. 6.

Figure 8:
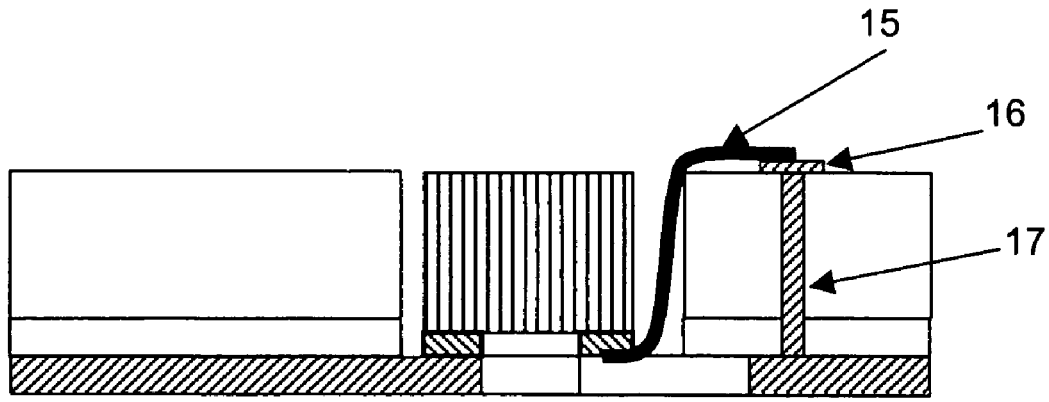
FIG. 8 represents a section of a card or an electronic label with an electronic component that has one contact connected to the conductive layer by means of a bridge coming from the opposite side of the substrate.

FIG. 8 shows an electric bridge (15) that is connected to an electronic component contact (11) passing close to the latter through the substrate. This bridge is then connected to a connection area (16) located on the opposite side of the substrate; said area is formed by a conductive element (17) that passes through the substrate. This element (17) is connected to the conductive layer (4).

A final optional step, not illustrated, for card or electronic label manufacturing consists in assembling a film of insulating material on each face in order to protect the assembly, illustrated in FIG. 6, from humidity or corrosion and moreover, to allow adequate marking (logo, characters, image etc.)

A variant of the card or the electronic label, not illustrated, according to the invention, is constituted by the assembling on a substrate of an adhesive layer and a conductive layer on each substrate's face. The substrate includes at least one window wherein an electronic component is housed. The adhesive layers maintain the conductive layers on each side of the substrate and at least one conductive layer extends partially into the surface of the window in such a way as to form at least one electrical contact. The electronic component contacts are connected, either by means of a bridge with at least one of the conductive layers covering the substrate, or by direct connection on the contact surface located in the window's substrate.

The substrate thickness of a card produced according to the method described by the invention can be compared to the maximum height of one or more electronic components even if these have a relatively high height. This is particularly the case for components such as batteries or displays. Therefore, this type of card can have several millimeters thickness, in particular when a great rigidity is desired.

The invention claimed is:

1. Method for manufacturing cards or electronic labels carried out by assembling at least one thin, flexible substrate, a conductive layer, an adhesive layer, and at least one electronic component, said conductive layer being made up of conductive tracks defining an antenna extending on a face of the substrate, comprising the steps of:
   cutting out of at least one segment into the conductive layer,
   cutting out of at least one window into the adhesive layer,
   cutting out, into the substrate, of at least one window intended to receive the electronic component,
   superimposition and lamination of the adhesive and conductive layers on the substrate in order to make correspond the windows made previously into the adhesive layer and into the substrate,
   realization, into the conductive layer, of an electric circuit made up of a plurality of tracks forming at least the antenna, and providing of at least one connection surface located in the window of the substrate for connecting the electronic component,
   positioning of the electronic component into the window of the substrate and connecting said electronic component to the connection surface previously provided.

2. Method according to claim 1, wherein the adhesive layer is made up of an adhesive film.

3. Method according to claim 1, wherein the adhesive layer is applied by silk-screening on the conductive layer with protected areas for cuffing out the windows.

4. Method according to claim 1, wherein the adhesive layer is applied by silk-screening onto the substrate with protected areas for cuffing out the windows.

5. Method according to claim 1, wherein the realization of the electric circuit is carried out by stamping, machining or chemical etching of the conductive layer.

6. Method according to claim 1, wherein the connection of said electronic component is carried out by soldering, cold or hot conductive bonding on the conductive film, or thermo-compression.

7. Method according to claim 1, wherein the cuffing out of the windows in the adhesive layer, the substrate and the segment in the conductive layer is carried out by stamping.

8. Method according to claim 1, wherein the conductive layer is deposited so as to extend partially into the surface of the window of the substrate and forms at least two electronic contacts on which the electronic component is connected.

9. Method according to claim 1, wherein the conductive layer is deposited in such a way as to extend into the surface of the window of the substrate and forms at least one electric contact on which the electronic component is connected, another electric contact being formed by means of a bridge connecting a more distant connection area on the conductive layer.

10. Method according to any one of the claims 1 to 9, wherein the thickness of the substrate is at least equal to the height of the highest electronic component.

11. Method according to claim 10, wherein a final step consists in assembling a film of insulating material on each face of the assembly, said film serving as protection support allowing a marking to be made.

12. Method according to any one of the claims 1 to 9, wherein a final step consists in assembling a film of insulating material on each face of the assembly, said film serving as protection support allowing a marking to be made.

* * * * *